United States Patent
Forscht et al.

(10) Patent No.: US 9,515,586 B2
(45) Date of Patent: Dec. 6, 2016

(54) POWER OUTPUT STAGE, METHOD FOR OPERATION

(71) Applicant: Robert Bosch GmbH, Stuttgart (DE)

(72) Inventors: Michael Forscht, Appenweier (DE); Michael Rummel, Achern-Oensbach (DE); Georg Schulze-Icking-Konert, Buehlertal (DE)

(73) Assignee: Robert Bosch GmbH, Stuttgart (DE)

( * ) Notice: Subject to any disclaimer, the term of this patent is extended or adjusted under 35 U.S.C. 154(b) by 84 days.

(21) Appl. No.: 14/411,760

(22) PCT Filed: May 15, 2013

(86) PCT No.: PCT/EP2013/060070
§ 371 (c)(1),
(2) Date: Dec. 29, 2014

(87) PCT Pub. No.: WO2014/005752
PCT Pub. Date: Jan. 9, 2014

(65) Prior Publication Data
US 2015/0171779 A1    Jun. 18, 2015

(30) Foreign Application Priority Data
Jul. 4, 2012   (DE) .................. 10 2012 211 577

(51) Int. Cl.
*H02P 6/00*    (2016.01)
*H02P 6/14*    (2016.01)
(Continued)

(52) U.S. Cl.
CPC ............... *H02P 6/14* (2013.01); *B60L 3/003* (2013.01); *G01R 31/024* (2013.01);
(Continued)

(58) Field of Classification Search
CPC .......... H02J 5/005; H02M 3/158; H01F 38/14; B60L 11/182; H03K 17/0828
(Continued)

(56) References Cited

U.S. PATENT DOCUMENTS 5,457,391 A     10/1995   Shimizu et al.
2005/0083116 A1*  4/2005  Risbo ...................... H03F 3/217
                                                          330/10
(Continued)

FOREIGN PATENT DOCUMENTS

DE       10359236         5/2005
JP       H11122981 A      4/1999
(Continued)

OTHER PUBLICATIONS

International Search Report for Application No. PCT/EP2013/060070 dated Nov. 22, 2013 (English Translation, 4 pages).

*Primary Examiner* — Eduardo Colon Santana
*Assistant Examiner* — Gabriel Agared
(74) *Attorney, Agent, or Firm* — Michael Best & Friedrich LLP

(57) ABSTRACT

The invention relates to a power output stage (1), in particular for a controller of an electrical machine (2) for a motor vehicle, comprising at least one control unit (8) and comprising at least four semiconductor switches (HS1, HS2, LS1, LS2) which can be individually actuated by the control unit (8) and which are connected to at least two half-bridges (4, 5) for operating the electrical machine (2) in order to form a bridge circuit (3), and are connected to a supply line (6) and an earth line (7) of the power output stage (1). Provision is made for the control unit (8) to have a controllable first pull-up apparatus (PU1) and a controllable first pull-down apparatus (PD1) for a first of the half-bridges (4) and a controllable second pull-up apparatus (PU2) and a controllable second pull-down apparatus (PD2) for a second
(Continued)

of the half-bridges (5), the control unit (8) actuating the semiconductor switches (HS1, HS2, LS1, LS2) the pull-up apparatuses (PU1, PU2) and the pull-down apparatuses (PD1, PD2) in a short-circuit test mode in order to detect a short-circuit current.

13 Claims, 1 Drawing Sheet

(51) Int. Cl.
  *G01R 31/40* (2014.01)
  *H02H 7/08* (2006.01)
  *H03K 17/0814* (2006.01)
  *H03K 17/18* (2006.01)
  *B60L 3/00* (2006.01)
  *G01R 31/02* (2006.01)
  *H02P 31/00* (2006.01)

(52) U.S. Cl.
  CPC ........... *G01R 31/025* (2013.01); *G01R 31/40* (2013.01); *H02H 7/0844* (2013.01); *H02P 31/00* (2013.01); *H03K 17/08142* (2013.01); *H03K 17/18* (2013.01); *B60L 2240/526* (2013.01); *B60L 2240/529* (2013.01); *B60L 2240/547* (2013.01); *H03K 2217/0027* (2013.01); *H03K 2217/0045* (2013.01)

(58) Field of Classification Search
  USPC ..................................................... 318/400.29
  See application file for complete search history.

(56) References Cited

U.S. PATENT DOCUMENTS

| | | | |
|---|---|---|---|
| 2006/0082330 A1* | 4/2006 | Montante | H05B 41/288 315/291 |
| 2006/0103458 A1* | 5/2006 | Hansen | H03F 3/211 330/10 |
| 2010/0122096 A1* | 5/2010 | Ozenc | G06F 1/26 713/300 |
| 2011/0002073 A1* | 1/2011 | Fukuda | H03F 1/523 361/87 |
| 2012/0019186 A1* | 1/2012 | Wagner | H02P 8/34 318/696 |
| 2012/0081052 A1* | 4/2012 | Wang | H02P 7/29 318/400.26 |
| 2012/0223664 A1* | 9/2012 | Januschevski | H02M 1/08 318/400.26 |

FOREIGN PATENT DOCUMENTS

JP  2003284354  10/2003
JP  2005067380  3/2005

\* cited by examiner

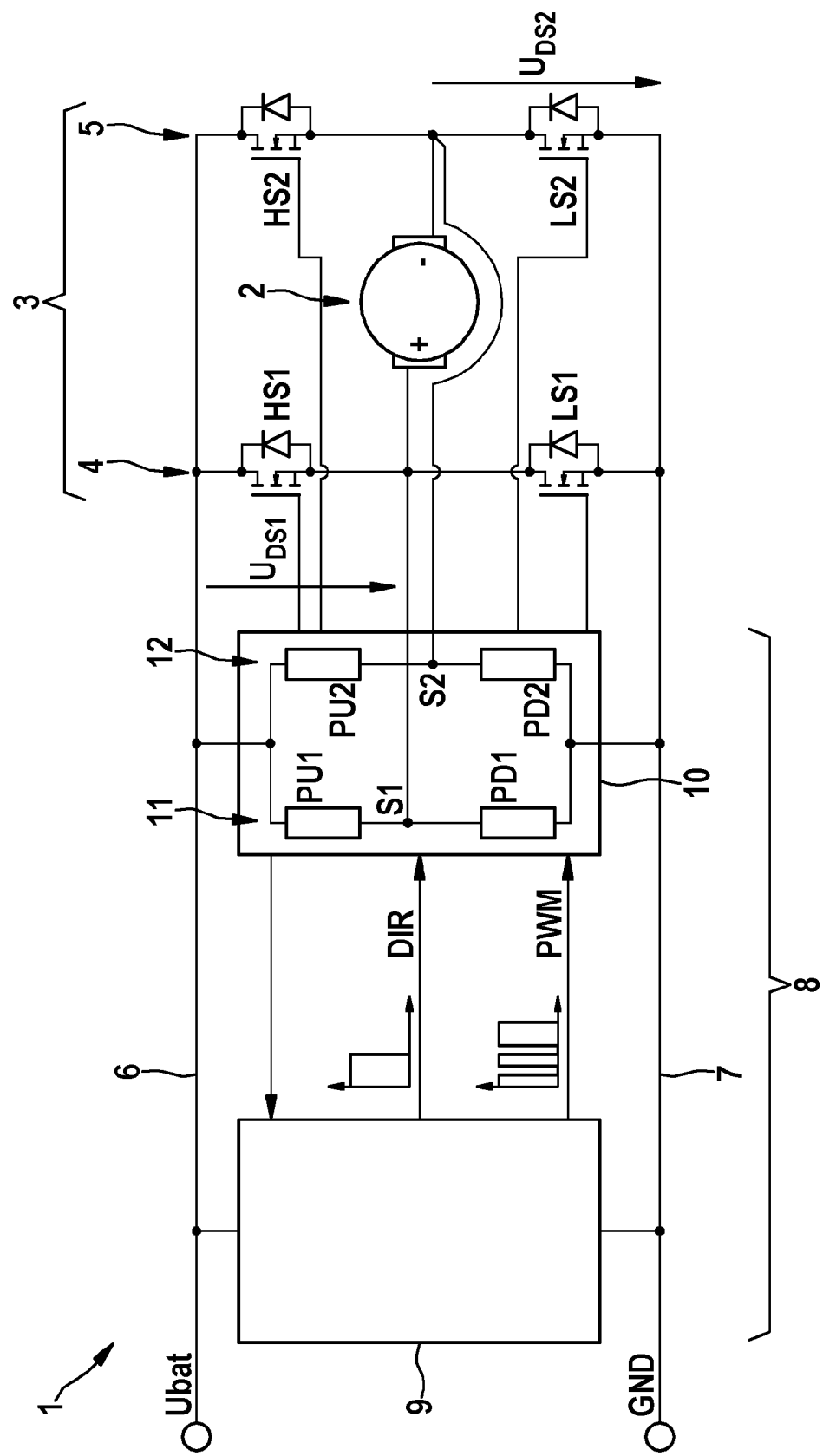

POWER OUTPUT STAGE, METHOD FOR OPERATION

BACKGROUND OF THE INVENTION

The invention relates to a power output stage, in particular for a controller of an electrical machine for a motor vehicle, comprising at least one control unit and comprising at least four semiconductor switches which can be individually actuated by the control unit and which are connected to at least two half-bridges for operating the electrical machine in order to form a bridge circuit, and are connected to a supply line and an earth line of the power output stage.

The invention further relates to a method for operating such a power output stage.

Power output stages as well as a method for operating the same are known from the technical field. In order to drive electrical machines, so-called clocked output stages or power output stages are frequently used which actuate the electrical machine by means of semiconductor switches that are interconnected in a bridge circuit. A constant supply d. c. voltage can be converted into a variable operating d. c. voltage for the electrical machine by means of a clocked, individual actuation of the semiconductor switches. So-called MOSFET switches are frequently used as semiconductor switches in this context. In order to protect the electrical machine as well as the power output stage from damage, a short-circuit detection is as a rule implemented into the power output stage in terms of device and/or process technology. The short-circuit detection in discrete MOSFET switches generally takes place by means of a drain-source voltage measurement in the control unit which actuates the semiconductor switches. In so doing, a high-voltage side semiconductor switch of a first bridge and a low voltage side semi-conductor switch of a second bridge are, for example, switched on and the voltage drop across the respective semiconductor switch is detected and compared to a target value. If the detected voltage does not lie in the expected range, the control unit can accordingly react and, for example, deactivate the power output stage. The disadvantage thereby is that this form of short-circuit detection can only be carried out in a power output stage through which current is passed. In addition, the drain-source voltage depends heavily on the on-state resistance of the respective semiconductor switch as well as on the short-circuit current. The first publication of the Japanese patent application JP 2005 067 380 A furthermore discloses a device and a method which enable a short-circuit detection of a bridge circuit which is designed as an H bridge without the electrical machine having to be driven.

SUMMARY OF THE INVENTION

The power output stage according to the invention has the advantage that a short-circuit detection can be carried out without starting up the electrical machine and in a simple and cost effective manner. The power output stage according to the invention provides for the control unit to have a controllable first pull-up apparatus and a controllable first pull-down apparatus for a first of the half-bridges and a controllable second pull-up apparatus and a controllable second pull-down apparatus for a second of the half-bridges, the control unit actuating the semiconductor switches, the pull-up apparatuses and the pull-down apparatuses in a short-circuit test mode in order to detect a short-circuit current. The power output stage is thus characterized by pull-up and pull-down apparatuses which can be used to pull the respective half-bridge to the voltage level of the supply line or to the voltage level of the earth line. By means of an appropriate actuation of the semiconductor switches as well as the pull-up and pull-down apparatuses, the power output stage can thus be tested for a possible short circuit even if the electrical machine is switched off. In so doing, a short circuit can, in particular, be detected (so-called offline diagnosis) even when no current is passed through the power output stage. The first pull-up apparatus and the first pull-down apparatus are expediently connected/arranged in series between the supply line and the earth line and in parallel with the second pull-up apparatus and the second pull-down apparatus which are likewise connected in series to one another. Respectively one connection line is thereby preferably provided which branches of between the respective pull-up and pull-down apparatuses and is connected in each case to one of the half-bridges.

The bridge circuit is preferably designed as an H bridge, a B6 bridge or as a 2H bridge and has a corresponding number of half-bridges as described above. The number of pull apparatuses is also expediently selected in accordance with the number of half-bridges, a pull apparatus having in each case a pull-up apparatus and a pull-down apparatus as previously described.

According to an advantageous modification to the invention, provision is made for the pull-up apparatuses to be designed as pull-up resistors, in particular high-impedance, and the pull-down apparatuses as pull-down resistors, in particular high-impedance. This ensures that only a low short-circuit current flows in the event of a possible short circuit and that the short-circuit detection is no longer dependent on the on-state resistance of the semiconductor switch. In addition, damage to the power output stage is reliably prevented as a result of the low short-circuit current.

The method according to the invention for operating the power output stage described above is characterized by the following steps:

a) The pull-down apparatuses are switched on and an output voltage of the respective half-bridge is detected and compared to a first target value.

b) The high-voltage side semiconductor switches of the half-bridges are, in addition to step a), consecutively activated and the output voltage of the respective half-bridge is detected and compared to a second target value.

c) The pull-up apparatuses are switched on and the output voltages of the half-bridges are detected and compared to a target value.

d) The low-voltage side semiconductor switches of the half-bridges are, in addition to step c), consecutively activated and the respective output voltage of the half-bridges is detected and compared to the first target value.

If the detected output voltages correspond in each case to the first or, respectively, second target value, a short circuit is not present and the power end stage can be put into operation. Otherwise a start-up of the power stage is refused.

The voltage of the ground line for the comparison is preferably used as the first target value. The voltage in the supply line for the detection or, respectively, determination of a short-circuit current is preferably used as a second target value. In step a), it is expected that the output voltages correspond in each case to the earth voltage. If, according to step b), the high-voltage side semiconductor switches are additionally activated, it is expected that the respective output voltage corresponds to the supply voltage if an interruption in one of the supply lines (open-load) or in the connection to the electrical machine is not present. In step c), it is expected that the output voltages of the supply voltage correspond to, and in step d), the voltage of the earth line, in particular if an interruption in one of the connection lines or in the connection to the electrical machine is not present (open-load).

According to an advantageous modification to the invention, provision is made for the individual steps a) to d) to be carried out in each case, starting from an initial situation in which all of the pull apparatuses and the semiconductor switches are deactivated. The steps a) and b) are preferably carried out while the pull-up apparatuses and the low-impedance semiconductor switches are deactivated. Provision is furthermore made for the steps c) and d) to be performed while the pull-down apparatuses and the high-voltage side semiconductor switches are deactivated.

According to an advantageous modification to the invention, provision is made for the steps a) and b) or the steps c) and d) to first be performed, so that first the steps a) and b) and subsequently the steps c) and d) are performed or that first the steps c) and d) and subsequently the steps a) and b) are performed. Of course, any other order of the steps a) to d) is however also possible, wherein it is required for the steps b) and d) that the pull-down apparatuses or, respectively, the pull-up apparatuses have previously been switched on/activated in accordance with the steps a) or b).

BRIEF DESCRIPTION OF THE DRAWINGS

The invention is to be explained below in detail with the aid of the drawing. To this end, the one FIGURE shows a simplified depiction of a power output stage.

DETAILED DESCRIPTION

The FIGURE shows a schematic diagram of a power output stage 1 in a simplified depiction, said power output stage being designed to drive an electrical machine 2. To this end, the power output stage 1 comprises a bridge circuit 3 which in the present example is designed as an H bridge circuit and has accordingly two half-bridges 4 and 5. The half-bridges 4 and 5 are connected between a supply line 6, which is/can be connected to a power source and therefore has a voltage Ubat, and an earth line. Each of the half-bridges 4 has two semiconductor switches HS1 and LS1 or, respectively, HS2 and LS2, from which respectively one switch is provided as a high-voltage side semiconductor switch HS1, HS2 and the other as a low-voltage side semiconductor switch. The semiconductor switches HS1, HS2, LS1, LS2 are in each case designed as MOSFET switching elements and are connected to a control unit 8 which actuates said semiconductor switches HS1, HS2, LS1, LS2 in a clocked manner by means of pulse width modulation PWM and as a function of a direction of rotation setting DIR.

The control unit 8 comprises a microprocessor 9 as well as a bridge control device 10, the bridge control device 10 actuating the semiconductor switches HS1, HS2, LS1 and LS2 and receiving the corresponding commands thereto from the microprocessor 9.

The bridge control device 10 comprises two pull apparatuses 11 and 12. The pull apparatuses 11 and 12 are provided to detect a short-circuit current in the power module 1. The first pull apparatus 11 comprises a first pull-up apparatus PU1 as well as a first pull-down apparatus PD1, which are connected in series to each other and are designed in each case as a switchable pull resistor. The second pull apparatus 12 correspondingly comprises a second pull-up apparatus PU2 as well as a second pull-down apparatus PD2, which are likewise connected in series and are designed as switchable pull resistors. The pull apparatuses 11 and 12 are connected in parallel and between the supply line 6 and the earth line 7. Each of the pull apparatuses 11 and 12 further comprises a sensor connection S1, S2 which is respectively connected between the corresponding pull-up apparatus PU1, PU2 and the corresponding pull-down apparatus PD1 and PD2 and is connected via a connecting line to the bridge circuit 3. As a result, the sensor connection S1 is connected to the half-bridge 4 and the sensor connection 2 to the half-bridge 5, so that the output voltages of the half-bridges 4 or 5 are applied to the sensor connections S1 or S2.

In order to detect a short-circuit current or an interruption in one of the supply lines or in a connecting cable to the electrical machine 2 (open-load detection), the process now proceeds as follows:

The control unit 8 actuates the semiconductor switches HS1, HS2, LS1, LS2 as well as the pull apparatuses 11 and 12 in such a way that the output voltages of the half-bridges 4 and 5 are compared to predefinable target values in order to determine a short-circuit current. To this end, four different states, starting from an overall deactivated state, are set:

a) The pull-down apparatuses PD1 and PD2 are initially activated, whereas the remaining elements are deactivated. The output voltages of the half-bridges 4 and 5 are detected with the aid of the sensor connections S1 and S2 and are compared to a first target value which corresponds to the potential GND on the earth line. If the output voltages coincide with the first target value, then a short circuit is not present. If the output voltages deviate from the first target value, a short circuit is detected and the power output stage 1 is deactivated or prevented from being activated.

b) In addition, the high-voltage side semiconductor switches HS1 and HS2 are consecutively activated and the resulting output voltages of the half-bridges 4 and 5 are compared to a second target value which corresponds to the supply voltage Ubat of the power source. If the output voltages coincide with the voltage of the supply line 6, there is no short circuit nor is there an interruption in one of the connection lines or in one of the connecting cables to the electrical machine 2 present. Otherwise the power end stage 1 is deactivated.

c) Next, starting from an overall deactivated state of the power end stage 1, if therefore all semiconductor switches HS1, HS2, LS1, LS2 and pull apparatuses 11 and 12 are deactivated, the pull-up apparatuses PU1 and PU2 are activated and the output voltages of the half-bridges 4 and 5 are compared to the second target value Ubat. If a short circuit is not present, the output voltages then correspond to the target value. Otherwise the power end stage 1 is deactivated.

d) In addition, the semiconductor switches LS1 and LS2 are subsequently activated consecutively and the resulting output voltage is detected with the sensor connections S1 and S2 and compared to the first target value GND. If the output voltages correspond to the first target value, a short circuit is not present nor is an interruption in the connection lines or in the connecting cables to the electrical machine 2 present. The power output stage 1 or, respectively, the electrical machine 2 can therefore be put into operation. Otherwise the power end stage 1 is deactivated.

The order of the steps specified above can, of course, also be changed. An advantage of the proposed method is that the short-circuit detection can also take place in the form of an offline diagnosis when no current is being passed through the power end stage 1. The pull-up and pull-down resistors are preferably designed to be of high impedance, so that, in the event of a short circuit, a short-circuit current that is low as possible flows in the states a) and c). The short-circuit detection is then no longer dependent on an on-state resistance of the semiconductor switch. In addition, as previously mentioned, an open-load detection, i.e. the detection of interruptions in the connection lines 6, 7 or in the connection to the electrical machine 2, is possible. The depth of diagnosis of the power end stage is significantly increased and offers more options for responding to the increased safety requirements of modern controllers or, respectively, power output stages.

The invention claimed is:

1. A power output stage (1), comprising at least one control unit (8) and comprising at least four semiconductor switches (HS1, HS2, LS1, LS2) which can be individually actuated by the control unit (8) and which are connected to at least two half-bridges (4, 5) for operating an electrical machine (2) in order to form a bridge circuit (3), and are connected to a supply line (6) and an earth line (7) of the power output stage (1), characterized in that the control unit (8) has a controllable first pull-up apparatus (PU1) and a controllable first pull-down apparatus (PD1) for a first of the half-bridges (4) and a controllable second pull-up apparatus (PU2) and a controllable second pull-down apparatus (PD2) for a second of the half-bridges (5), the control unit (8) actuating the semiconductor switches (HS1, HS2, LS1, LS2), the pull-up apparatuses (PU1, PU2) and the pull-down apparatuses (PD1, PD2) in a short-circuit test mode in order to detect short-circuit current; the control unit (8) configured to detect a short-circuit current by:
   a) switching on the pull-down apparatuses (PD1, PD2) and detecting a first output voltage of the respective half-bridge (4, 5) and comparing the detected first output voltage to a first target value (GND), and consecutively activating the high-voltage side semiconductor switches (HS1, HS2) of the half-bridges (3, 4) and detecting a second output voltage of the respective half-bridge (4, 5) and comparing the detected second output voltage to a second target value (Ubat),
   b) switching on the pull-up apparatuses (PU1, PU2) and detecting a third output voltage of the half-bridges (4, 5) and comparing the detected third output voltage to the second target value (Ubat), and consecutively activating the low-voltage side semiconductor switches (LS1, LS2) of the half-bridges (4, 5) and detecting a fourth output voltage of the half-bridges (4, 5) and comparing the detected fourth output voltage to the first target value (GND).

2. The power output stage according to claim 1, characterized in that the bridge circuit (3) is designed as an H bridge, a B6 bridge or as a 2H bridge.

3. The power output stage according to claim 1, characterized in that the pull-up apparatuses (PD1, PD2) are designed as pull-up resistors, in particular high-impedance, and the pull-down apparatuses (PD1, PD2) as pull-down resistors, in particular high-impedance.

4. The power output stage according to claim 1, wherein the power output stage is for a controller of an electrical machine (2) for a motor vehicle.

5. The power output stage according to claim 1, characterized in that the bridge circuit (3) is designed as a B6 bridge.

6. The power output stage according to claim 1, characterized in that the bridge circuit (3) is designed as a 2H bridge.

7. The power output stage according to claim 1, characterized in that the pull-up apparatuses (PD1, PD2) are designed as high-impedance pull-up resistors.

8. The power output stage according to claim 1, characterized in that the pull-down apparatuses (PD1, PD2) as high-impedance pull-down resistors.

9. A method for operating a power output stage (1) comprising at least one control unit (8) and comprising at least four semiconductor switches (HS1, HS2, LS1, LS2) which can be individually actuated by the control unit (8) and which are connected to at least two half-bridges (4, 5) for operating the electrical machine (2) in order to form a bridge circuit (3), and are connected to a supply line (6) and an earth line (7) of the power output stage (1), the control unit (8) having a controllable first pull-up apparatus (PU1) and a controllable first pull-down apparatus (PD1) for a first of the half-bridges (4) and a controllable second pull-up apparatus (PU2) and a controllable second pull-down apparatus (PD2) for a second of the half-bridges (5), the method comprising the following steps for detecting a short-circuit current:
   a) The pull-down apparatuses (PD1, PD2) are switched on and an output voltage of the respective half-bridge (4, 5) is detected and compared to a first target value (GND),
   b) The high-voltage side semiconductor switches (HS1, HS2) of the half-bridges (3,4) are, in addition to step a), consecutively activated and the output voltage of the respective half-bridge (4, 5) is detected and compared to a second target value (Ubat),
   c) The pull-up apparatuses (PU1, PU2) are switched on and the output voltage of the half-bridges (4, 5) is detected and compared to the second target value (Ubat),
   d) The low-voltage side semiconductor switches (LS1, LS2) of the half-bridges (4, 5) are, in addition to step c), consecutively activated and the respective output voltage of the half-bridges (4, 5) is detected and compared to the first target value (GND).

10. The method according to claim 9, characterized in that the voltage of the earth line (7) is specified as the first target value (GND) and the voltage of the supply line (6) is specified as the second target value (Ubat).

11. The method according to claim 9, characterized in that the steps a) and b) are performed while the pull-up apparatuses (PU1, PU2) and the low-voltage side semiconductor switches (LS1, LS2) are deactivated.

12. The method according to claim 9, characterized in that the steps c) and d) are performed while the pull-down apparatuses (PD1, PD2) and the high-voltage side semiconductor switches (HS1, HS2) are deactivated.

13. The method according to claim 9, characterized in that the steps a) and b) or the steps c) and d) are first performed.

* * * * *